(12) United States Patent
Fernando

(10) Patent No.: US 6,909,980 B2
(45) Date of Patent: Jun. 21, 2005

(54) AUTO SKEW ALIGNMENT OF HIGH-SPEED DIFFERENTIAL EYE DIAGRAMS

(75) Inventor: Chenjing Fernando, Windsor, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 237 days.

(21) Appl. No.: 10/387,706

(22) Filed: Mar. 13, 2003

(65) Prior Publication Data

US 2004/0181350 A1 Sep. 16, 2004

(51) Int. Cl.[7] .............................................. G06F 19/00
(52) U.S. Cl. ............................. 702/66; 702/67; 702/85
(58) Field of Search ............................. 702/85, 67, 66; 398/102; 385/11; 370/517; 369/44.29, 124.14; 330/10, 149

(56) References Cited

U.S. PATENT DOCUMENTS 6,636,932 B1 * 10/2003 Regev et al. ................ 710/317
6,708,003 B1 * 3/2004 Wickham et al. ........... 398/102
6,748,126 B2 * 6/2004 Koch et al. .................... 385/11

OTHER PUBLICATIONS

Agilent 86118A Dual 60+ GHz Electrical Remote Head, Aglient Technologies, Inc., 5988–5903EN, (Mar. 18, 2002).
86100B Family Plug–In Module Matrix, Aglient Technologies, Inc., 5988–6767EN, (Jul. 10, 2002).
Derickson, Dennis, Fiber Optic Test and Measurement, Prentice–Hall, Chapter 8, pp. 284–338, (1998).
Scott, J., et al. "Removal of Cable and Connector Dispersion in Time–Domain Waveform Measurements on 40Gb ICs," Agilent Technologies, Santa Rosa, CA, pp. 1–4.

Cai, Y., et al. "Digital Serial Communication Device Testing and Its Implication on Automatic Test Equipment Architecture," in ITC International Test Conference (IEEE), New York, pp. 600–609, (2000).
Keiser, Gerd, "Optical Fiber Communications," McGraw–Hill, pp. 230–233, (1983).
Hart, Michael, et al. "Firmware Measurement Algorithms for the HP 83480 Digital Communications Analyzer," Hewlett–Packard Journal, Article 1, p. 1–9, (Dec. 1996).
"86118A Dual70+ GHz Electrical Remote Head," http://www.agilent.com/cm/rdmfg/commanlyz/86118a/index.shtml, pp. 1–2, (Aug. 13, 2002).
"86100B Infiniium DCA Wide–Bandwidth Oscilloscope," http://www.agilent.com/cm/rdmfg/commanlyz/86100a/index.shtml, pp. 1–2, (Aug. 13, 2002).

* cited by examiner

*Primary Examiner*—John Barlow
*Assistant Examiner*—Stephen J. Cherry

(57) ABSTRACT

Auto-skew alignment of high-speed eye diagrams of a pair of differential signals defines a figure of merit containing time integrals of mathematical functions dependent on magnitudes of the differential signals and related skew, then calculating an optimized skew value that minimizes the figure of merit. Optimally integrals are performed over a random time interval including at least two consecutive bit periods of the differential signals. Calculations include coarse search for optimum skew and fine search using an adaptively decreasing fine skew interval. Data acquisition and control hardware includes paired independent skew circuits and paired sampling circuits coupled to a timebase generator and a processing unit, which performs calculations in accordance with an auto-deskew algorithm. The accuracy of the optimized skew value is limited only by hardware skew resolution which in present implementations is less than or equal to one picosecond.

20 Claims, 4 Drawing Sheets

AUTO SKEW ALIGNMENT OF HIGH-SPEED DIFFERENTIAL EYE DIAGRAMS

CROSS-REFERENCE TO RELATED APPLICATIONS

This application is related to co-pending and commonly assigned U.S. patent application Ser. No. 10/387,791 entitled "VARIABLE DATA RATE BIT ERROR MEASUREMENTS USING BIT REPLICATION," the disclosure of which is hereby incorporated herein by reference.

TECHNICAL FIELD

The invention relates to instrumentation and methods for performance measurement of high data rate digital communications systems and particularly to auto-skew alignment of high-speed differential eye diagrams.

BACKGROUND OF THE INVENTION

The increased deployment of Gigabit differential signals in IC components and systems for high-speed telecommunication applications presents challenges in signal analysis and measurement. One such challenge resides in skew alignment of the high-speed differential signals as represented by differential eye diagrams. Today's telecom systems are designed to move large amounts of data at bit rates that far exceed 1 Gbit/sec, with signal edge durations below 200 picoseconds. At these speeds, effects once deemed secondary, such as differential skew, can become prominent.

The timing skew between a pair of differential signals is called differential skew. The differential skew introduced by matching cabling and adapters used to connect test equipment and devices under test (DUTs) can add to the skew by as much as several hundred picoseconds. Considering that the bit period of a 40 Gbps signal is only 25 ps, an accurate auto skew alignment is mandatory for high speed differential signal analysis and measurement.

The traditional eye diagram crossing-point matching or edge-matching method (see for example Derickson, "Fiber Optic Test and Measurement," Chapter 8, Prentice-Hall, 1998) is subject to both-amplitude noise and timing-jitter. Since this traditional method is based solely on measurement algorithms, it depends strongly on signal type, e.g., Return to Zero (Rz) or Non-Return to Zero (NRZ), (see for example Keiser, "Optical Fiber Communications," McGraw-Hill, 1983, pp. 230–233), and tends to break down or become unstable when measurement fails.

The accuracy of the synchronization mechanism utilized in BERT (bit error rate test) instruments for aligning two out of sync signals is dependent on the bit period of the signals. The bit-synchronization mechanism commonly adopted in telecommunications likewise suffers from accuracy problems and complex digital logic. In other words, no existing sync or alignment mechanisms address the compelling issue of cable/connector skew compensation for accurate differential signal analysis and measurement.

F1 and F2 are said to be paired differential signals if $$F1(t)+F2(t)=C, \quad (1)$$

where C is a constant, independent of time t. The signals could be either optical or electrical, although in reality only electrical differential signals are presently used. When there is a differential skew (ts) between the 2 signals, for example, F2=F2(t+ts), then the differential signal becomes $$S(t)=F1-F2=F1(t)-F2(t+ts). \quad (2)$$

Assuming that ts is comparatively small, S(t) may be represented as $$S(t)=F1(t)-F2(t)-ts*F2'(t), \quad (3)$$

where F2'(t) is the time derivative of F2(t).

Substituting (1) into (3) and considering timing jitter effect:

$$S(t)=2*F1(t)-C-(ts+2*Tjitter)*F2'(t), \quad (4)$$

where Tjitter is the average jitter, and F'(t) is the time derivative of F(t). As expected, differential skew (ts) aggravates jitter measurement. For 40 Gbps signals, jitter measurement of differential signals can be completely blurred due to the differential skew introduced by the measurement instrument and peripherals. In other words, the presence of ts distorts the output differential signal S(t), particularly in the rising/falling edge part of the waveform when the derivative F2'(t) is not zero. The distortion becomes apparent in eye diagram parameter measurements such as rise and fall time of high-frequency signals.

FIG. 1 illustrates an example of 40 Gbps NRZ differential eye diagrams at various skew misalignment stages. Measurement results are derived from the subtraction of the input differential signals from Agilent ParBert with matching cables and connectors linked to Agilent Infiniium DCA through 86118A remote head module. A tri-level differential eye diagram due to grossly misaligned skew (>1 bit period) in the input differential signals is illustrated at 101a. A distorted differential eye diagram due to moderately misaligned skew (from about 0.25 to 1.0 bit period) in the input differential signals is illustrated at 101b. A "good" differential eye diagram due to slightly misaligned skew (less than about 0.25 bit period) in the input differential signals is illustrated at 101c. However, there is still about 4 ps skew in the slightly misaligned input differential signals. Even though misalignment at 101c is hardly perceptible visually, even this slight misalignment can affect eye measurement significantly, especially the rise/fall time, where tr is rise time and tf is fall time as illustrated at 101d. In this example, ideal alignment is reached when ts=0, at which point tr, tf are each roughly 7 ps. It is readily observed that for a 40 Gbps differential signal as shown in FIG. 1, only 3–4 ps of skew misalignment can result in rise/fall time measurement errors as much as 1.5 ps, or ~20% relative error.

Eye diagram measurement is described generally in Hart et al., "Firmware Measurement Algorithms for the HP 83480 Digital Communications Analyzer," Hewlett-Packard Journal December 1996, Article 1, p. 1; Scott et al., "Removal of Cable and Connector Dispersion in Time-Domain Waveform Measurements on 40 Gb ICs," jonathanscott@ieee.org; Cai et al., "Digital Serial Communication Device Testing and Its Implications on Automatic Test Equipment Architecture, IEEE ITC International Test Conference 2000, Paper 23.1, p. 600; Agilent Technologies data sheet DCA 86118A, http://www.agilent.com/cm/rdmfg/commanlyz/86118a/index.shtml; and link to general information regarding Agilent Technologies DCA 86100A/B, http://www.agilent.com/cm/rdmfg/commanlyz/85100a/index.shtml.

BRIEF SUMMARY OF THE INVENTION

The present invention is directed to a system and method for auto-skew alignment of high-speed eye diagrams of a pair of differential signals having differential timing skew. The method defines a figure of merit containing time integrals of mathematical functions dependent on magnitudes of the differential signals and related skew, then calculating an optimized skew value that minimizes the figure of merit. Optimally time integrals are performed over a random time interval including at least two consecutive bit periods of the differential signals. Calculations include coarse search for optimum skew and fine search using an adaptively decreasing fine skew interval. Data acquisition and control hardware instrumentation includes paired independent skew circuits and paired sampling circuits coupled to a timebase generator and a processing unit, which performs calculations in accordance with an auto-deskew algorithm. The accuracy of the optimized skew value is limited only by hardware skew resolution, which in present implementations is less than or equal to one picosecond.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

GLOSSARY OF TERMS AND ACRONYMS

Figure 1:
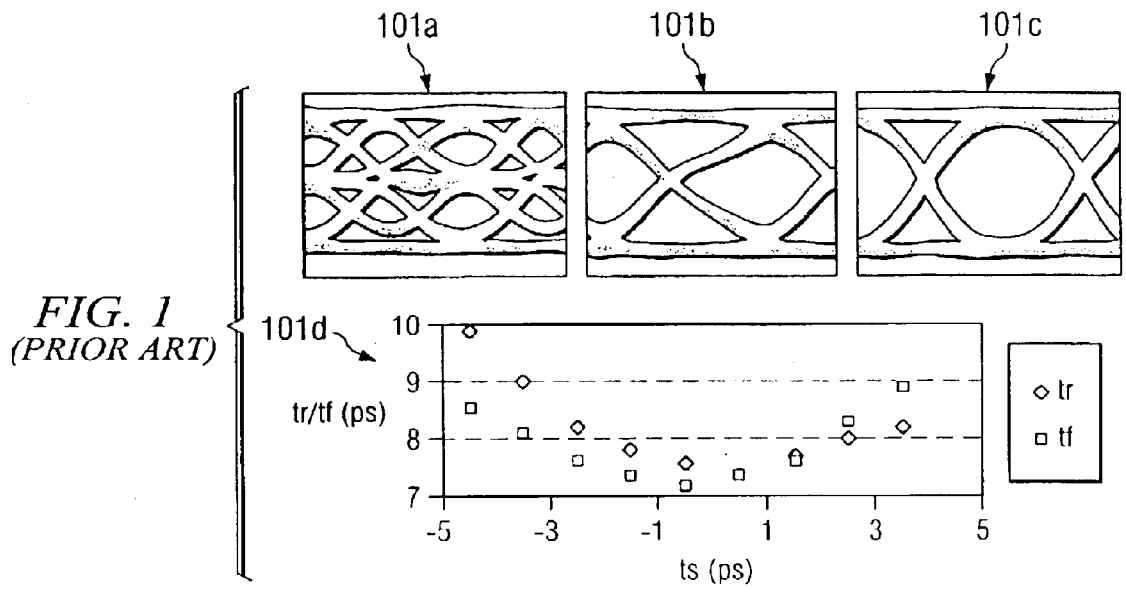
FIG. 1 illustrates an example of 40 Gb/s NRZ differential eye diagrams at various skew misalignment stages.

| | |
|---|---|
| BER | Bit error ratio; ratio of total number of errors to total number of incoming bits. |
| Compare | Look for differences between PG pattern and locally generated ED pattern; an indication of errors in the incoming PG data. |
| DCA | Digital Communications Analyzer. |
| Delay | Method of synchronizing. |

-continued

GLOSSARY OF TERMS AND ACRONYMS

| | |
|---|---|
| DUT | Device under test. |
| Error Count | Total number of miscompares (errors). |
| Ethernet | Data communications standard (LAN) 1.25 Gb/s. |
| Eye Crossing | Defined as the point in time when rising and falling edges of the eye diagram intersect. |
| Eye Diagram | A display produced by overlaying all bits on top of each other; such a display is commonly produced with an oscilloscope triggered on the clock signal; there are 0--> 1 transitions (rising edges) and 1--> 0 transitions (falling edges) at both the left edge (data transitions immediately before the digital decision delay); and at the right edge (data transitions immediately after the digital decision delay). |
| Fiber Channel | Storage area network standard 1.06 Gb/s; 2 x Fiber Channel 2.12 Gb/s. |
| FPGA | Field programmable gate array. |
| NRZ | In NRZ nonreturn-to-zero codes a transmitted data bit occupies a full bit period. These codes are simple to generate and decode, but they possess no inherent error-monitoring or correcting capabilities and they have no self-clocking (timing) features. A long string of consecutive 1 bits can result in a baseline wander effect. |
| PRBS | Pseudo Random Bit Sequence; a deterministic series of bits which has a "white noise" pattern distribution (all bit combinations); this pattern is relatively easy to generate in digital hardware and it is also easy to synchronize the ED PRBS generator to the incoming PRBS bit stream from the PG. |
| RZ | For RZ return-to-zero formats the pulse width is less than a full bit period. If an adequate bandwidth margin exists, each data bit can be encoded as two optical line code bits. In these codes a signal level transition occurs during either some or all of the bit periods to provide timing information. |
| Slice | Method of changing the voltage threshold of the decision circuit; how large a voltage constitutes a "0" vs. a "1"; adjusted for minimum BER. |
| SONET | Synchronous Optical Network (optical communications standard); various data rates, for example OC-48 2.488 Gb/s OC-12 622 Mb/s. |

DETAILED DESCRIPTION OF THE INVENTION

A method in accordance with embodiments of the present invention is based on the integral addition of the two differential signals. An optimized value of skew ts is calculated, such that figure of merit $$FOM = (\int |F1(t1) + F2(t2+ts)|dt)/(\int |F1(t1)|dt + \int |F2(t2+ts)|dt) \quad (5)$$

reaches a minimum, which occurs when ts=t1−t2, which accordingly becomes the optimized skew value. Since the method uses integration over a wide time duration, immunity to jitter and noise is greatly enhanced. If ts=t1−t2+Δt, then when Δt approaches zero, FOM becomes $$FOM = |\Delta t|(\int |F1'(t)|dt)/(\int |F1(t)|dt + \int |F2(t)|dt). \quad (6)$$

Thus, when Δt approaches zero, FOM reaches a minimum as well, limited only by amplitude noise, because jitter has been minimized by integration. For the method to work optimally, the time derivative F1'(t) of signal F1(t) should be non-zero. In other words, the range of acquired data should include at least one edge slope of waveform F1(t). FOM does not need any detailed information regarding edges, be it double-edge or not. FOM is independent of signal type (RZ/NRZ), because it does not need any information regarding the signal type, so long as some edge/edges are included in the data, since FOM optimally requires a non-zero time derivative.

Additionally, for the present method to work optimally, first, hardware should be capable of high skew accuracy; second, there should be a pair of input differential signals as defined above in Equation (1); third, data should be obtained via an equivalent time base oscilloscope to ensure that integration is performed over a random and sufficiently long time interval, i.e., over at least multiple consecutive bit periods.

Figure 2:
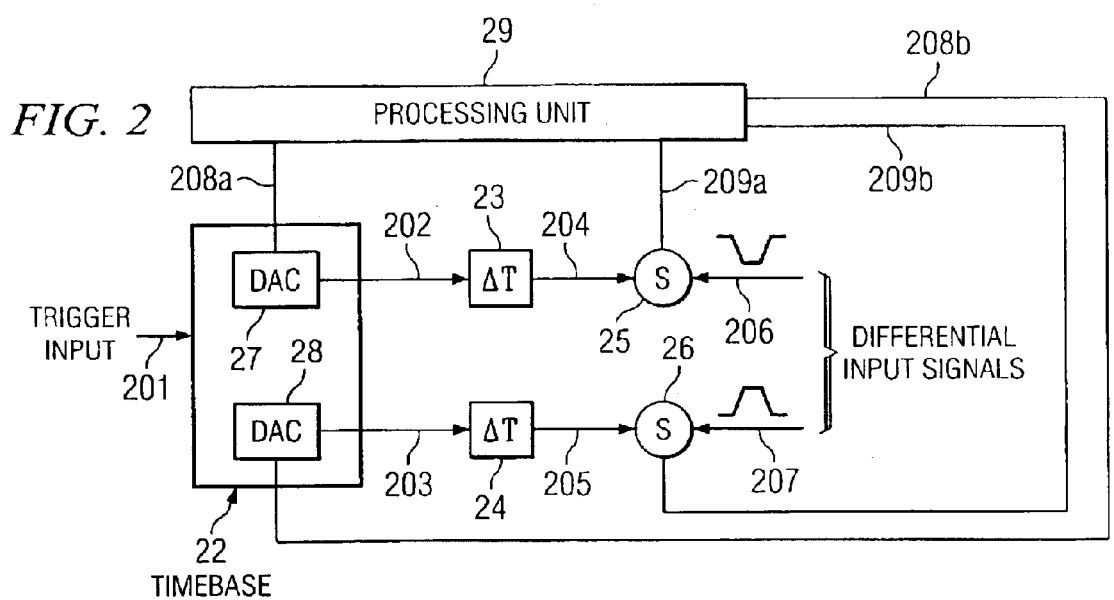
FIG. 2 is a hardware block diagram representing skew circuits and sampler circuits coupled to respective differential input signals, in accordance with embodiments of the present invention.

FIG. 2 is a hardware block diagram representing skew circuits ($\Delta T$) 23, 24, and sampler circuits (S) 25, 26, coupled to respective differential input signals 206, 207. By accurately controlling skew circuits 23, 24 over respective signal paths 202, 203, fine skew alignment of paired input differential signals 206, 207 is obtained. Skew circuits 23, 24 are controlled by respective software-driven skew DACs 27 and 28, for example by delaying paired input signals 206 and 207 independently and accurately over signal paths 204 and 205 after respective sampler circuits 25 and 26 to achieve accurate adjustment of the final skew of differential output signal S(t). In some embodiments, for example, Agilent 86100A/B mainframe provides timebase generator 22, while Agilent DCA module 86118A provides sampling functions 25, 26 as depicted in FIG. 2, although the present method is not limited to those particular modules. Processing unit 29 provides signal acquisition, control, and analysis, and performs calculations in accordance with an auto-deskew algorithm. Processing unit 29 is coupled to skew DACs 27, 28 and to sampler circuits 25, 26 over control and data links 208a–208b and 209a–209b, which can represent hardware and/or software coupling links. In some embodiments, hardware instrumentation represented in FIG. 2 includes O/E (only for optical modules), filters, sampler, and IF amplifier.

Figure 3:
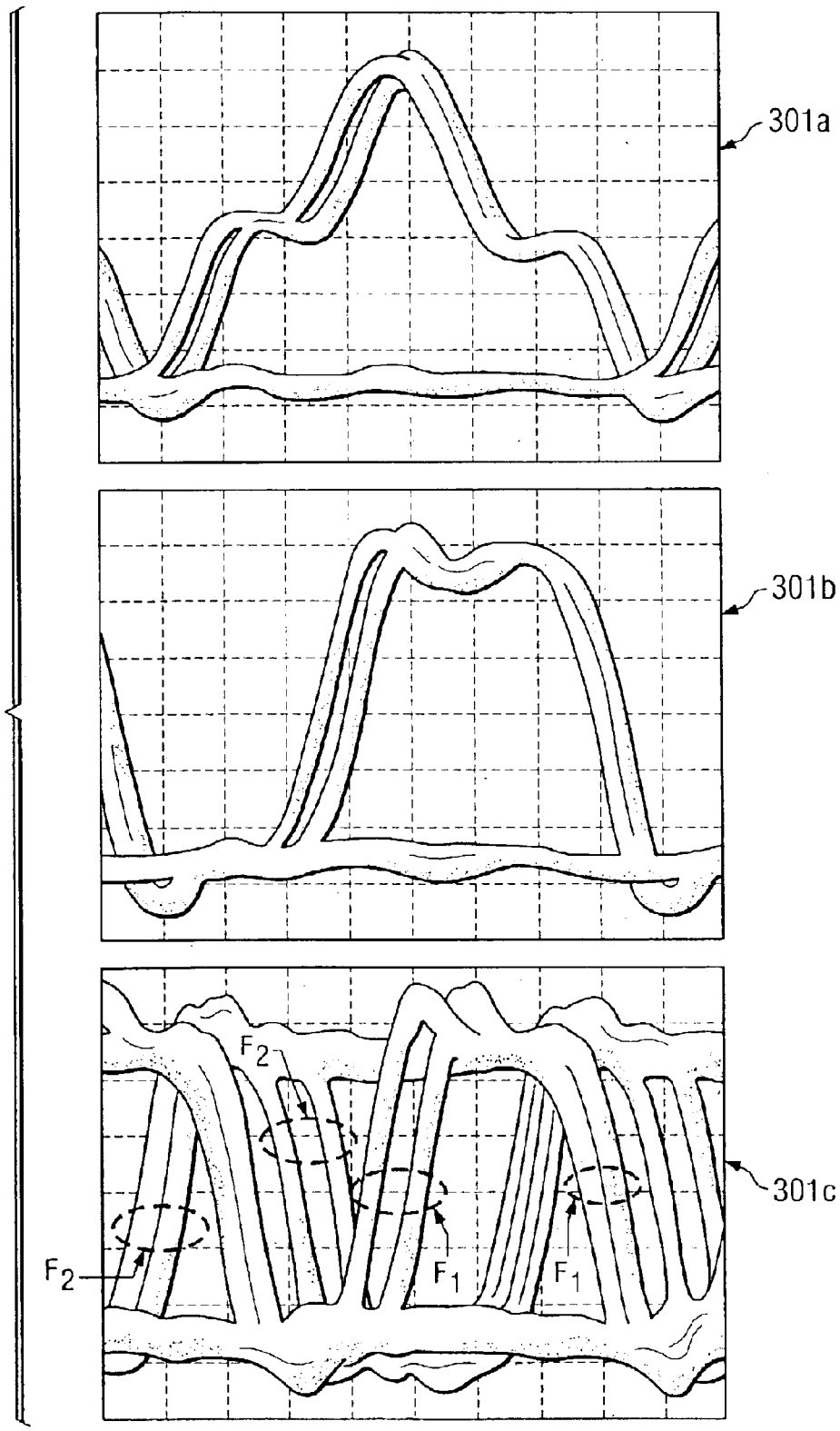
FIG. 3 is a graphic representation illustrating differential eye diagrams of 3.5 GHz RZ signals, before and after auto-skew alignment.

FIG. 3 is a graphic representation illustrating differential eye diagrams of 3.5 GHz RZ signals, before and after auto-skew alignment at 301a and 301b respectively. At 301c is shown a superposition of paired input signals F1 and F2 before skew alignment. There are two distinct patterns in the input signals, resulting in bimodal rising and falling edges, which can generally impose difficulties in performing measurement algorithms, hence potentially causing failure or instability when using the traditional edge-matching skew alignment method. The method of the present invention is immune to such abnormality and provides a superior solution to differential skew misalignment of paired high-frequency signals.

Figure 4:
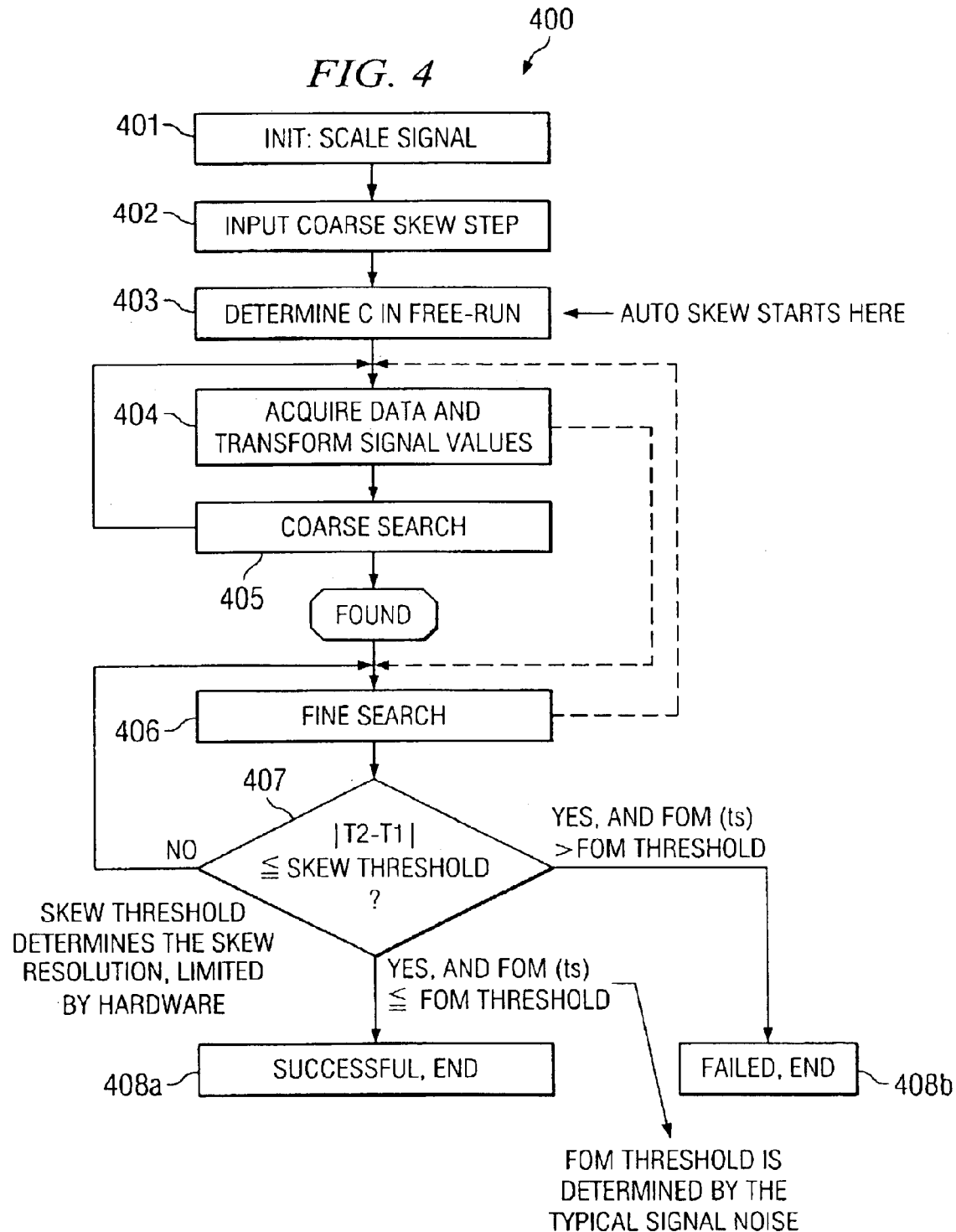
FIG. 4 is a flow diagram depicting the operation of an auto-deskew algorithm, in accordance with embodiments of the present invention, which calculates the values of t1 and t2 that make FOM minimum.

FIG. 4 is a flow diagram depicting the operation of an auto-deskew algorithm, in accordance with embodiments of the present invention, which calculates the values of t1 and t2 that make FOM minimum (fine adjust t1 and t2 via the skew DAC), then ts=t2–t1, the accuracy of which is limited by the resolution of t2 and t1. Since the skew circuit resolution (t1, t2) is less than 1 ps, then so is ts. As described in connection with the hardware block diagram in FIG. 2, software controls skew DAC 27, 28, and the skew DAC controls each respective skew circuit.

Figure 5:
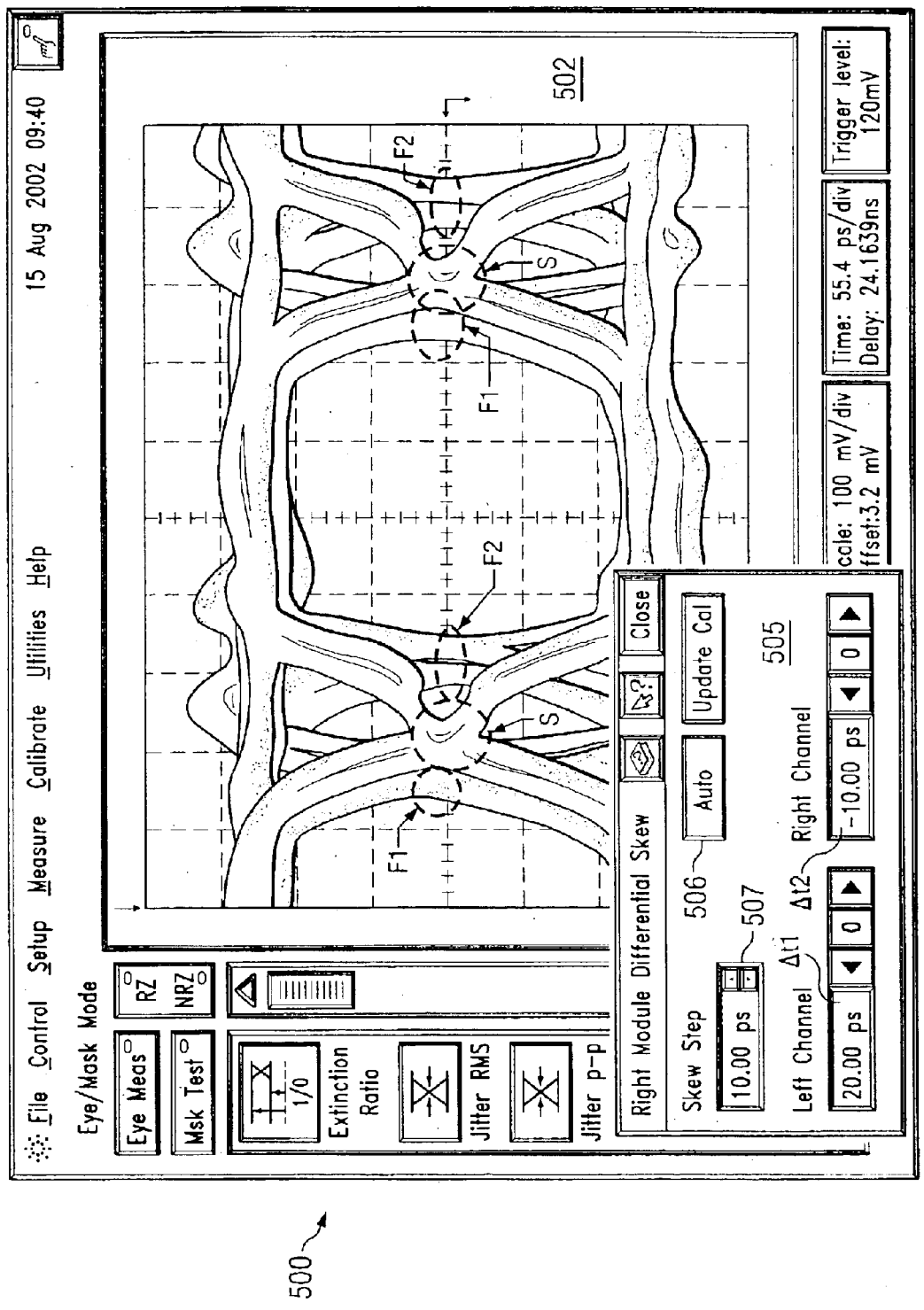
FIG. 5 is a schematic representation of a typical user interface displayed during the operation of the auto-deskew algorithm of FIG. 4.

FIG. 5 is a schematic representation of a typical user interface displayed during the operation of the auto-deskew algorithm of FIG. 4. Interface display 500 shows a graphic representation 502 of paired signals F1, F2, and differential signal S superimposed together prior to skew-alignment. Also shown is a control dialog box 505 for the auto-deskew function. When "auto" button 506 is pressed, the auto-deskew algorithm depicted in flow diagram 400 starts to perform its function. Skew interval 507 shown in the dialog box of the user interface is a user-preselected "coarse" interval, as described in connection with flow diagram 400 of the auto-deskew algorithm below.

In flow diagram 400 at step 401, initialize the auto-deskew algorithm by scaling signals F1, F2, making certain that at least 2 edges of signals F1, F2 are displayed via manual or autoscale.

At step 402, select coarse interval size TSTEPc 507 at dialog box 505, where TSTEPc is a time interval less than the bit period of input signals F1, F2. "AUTO" button 506 is pressed to initiate auto-deskew operation step 403 and all subsequent steps.

At step 403 in auto-deskew mode, determine C1 and C2 in free run mode, where C1=average of (F1), C2=average of (F2).

At step 404, acquire data and transform F1(t1) into {F1(t1)–C1} and F2(t2) into {F2(t2)–C2}; then go to step 405 if in coarse search loop or to step 406 if in fine search loop (see dashed lines).

At step 405, perform coarse search for ts.

Let $ts = n*TSTEPc$, where $n=0, \pm(1, 2, N)$.

Assuming that the hardware skew range for each channel path is [tleft, tright], i.e. tleft=minimum skew (<0), tright=maximum skew (>0);
$\Delta t1$ denotes absolute skew desired for channel 1 and $\Delta t2$ denotes absolute skew desired for channel 2 in order to reach the relative skew (ts) between the two channels;

then $ts = t1 - t2 = (t + \Delta t1) - (t + \Delta t2) = \Delta t1 - \Delta t2$ and $N = (tright - tleft)/TSTEPc$.

To achieve selected ts, define:
For (ts>0), $$\left. \begin{array}{l} \Delta t1 = ts * tright / (tright - tleft) \\ \Delta t2 = ts * tleft / (tright - tleft); \text{ and} \end{array} \right\} Ts > 0$$

For (ts<0), $$\left. \begin{array}{l} \Delta t1 = -ts * tleft / (tright - tleft) \\ \Delta t2 = -ts * tright / (tright - tleft); \end{array} \right\} Ts < 0$$

where tleft<0, tright>0, to ensure in both cases that $\Delta t1$ has the same sign as that of ts, where ts=$\Delta t1 - \Delta t2$. It is advantageous to have $\Delta t1 > 0$, $\Delta t2 < 0$ for ts>0 and $\Delta t1 < 0$, $\Delta t2 > 0$ for ts<0, in order to fully utilize the hardware skew range capability. The hardware can have negative skew, because the default absolute skew is set in the middle of the possible skew range, and the skew search is then performed backward or forward around the default value, thus effectively skewing the channel negative or positive. $\Delta t1$ and $\Delta t2$ are directly controlled by skew DACs.

Loop through n, i.e. vary $\Delta t1$ and $\Delta t2$ accordingly, for each n, repeat step 404 to acquire data and search for ts=Tc such that FOM(Tc) is minimum.

At step 406, perform fine search of ts within fine interval [T1,T2], where $T1 = \min(tleft - tright, Tc - TSTEPc/2)$, $T2 = \max(tright - tleft, Tc + TSTEPc/2)$.

($\Delta t1$ and $\Delta t2$ derivation from ts is the same as in step 405.)

Let ts=T1, (T1+T2)/2, and T2; calculate FOM(ts) based on repeating step 404 (see dashed lines).

Select T that makes above-calculated FOM(T) smallest; then set new interval:

$T1new = \min(t_{left} - t_{right}, T-(T2-T1)/2)$;

$T2new = \max(t_{right} - t_{left}, T+(T2-T1)/2)$.

At step 407, (1) if T2new−T1new<=desired accuracy and FOM<=pre-set noise threshold, go to step 408*a*;
(2) else if T2new−T1new<=desired accuracy and FOM>pre-set noise threshold, go to step 408*b*;
(3) else if T2new−T1new>desired accuracy, replace T1 with T1new and T2 with T2new, then repeat step 406 within the new fine interval [T1new, T2new], recalculating (Δt1, Δt2, ts) and repeating step 404.

At step 408*a*, auto-skew alignment is successful, i.e. the skew-free differential eye diagram is displayed and the final skew value ts (or individual Δt1 and Δt2) is displayed; END of the auto-skew alignment.

At step 408*b*, auto-skew alignment failed; END of the auto-skew alignment.

If coarse skew interval TSTEPc is set at the hardware skew resolution, there is a performance trade-off. For example, if skew interval 507 is set to 1 ps, then fine search step 406 is simply ignored. However, the drawback is that the performance time is longer using the coarse search method alone (which requires in the order of O(N) iterations, whereas, the fine search method requires in the order of O(log(N)) iterations). Moreover, fine search step 406 works only for skew (ts) less than the bit period. Accordingly, an optimum method combines both coarse and fine search, as described in detail in connection with flow diagram 400, i.e., using coarse search step 405 to narrow down the rough skew interval to less than 1 bit period of resolution, then using fine search step 406 to finish the process. As described above, fine search step 406 is performed by adaptively decreasing the fine search interval to converge to the final skew value. In other words, the fine interval is automatically adjusted in the algorithm, until it is less than the hardware resolution, when the algorithm ends. The algorithm accuracy is thus limited by skew circuit hardware. The implementation using Agilent DCA 86118A realizes accuracy <1 ps, which has never before been observed in the prior art. As depicted in FIG. 2, after paired differential signals propagate through sampler circuit 25, 26, both input signal time delays (t1 and t2) can be directly controlled by varying each individual respective skew DAC 27, 28, which in turn controls skew circuit 23, 24, similar to a delay circuit.

The method according to the present invention overcomes the obstacles of the prior art. It advantageously automatically aligns a pair of differential eye diagrams within an accuracy of less than 1 ps regardless of signal type (RZ or NRZ) and independently of algorithm type. In principle, the method can be applied to de-skewing of any differential signals within equipment test or in the field if capable hardware is also available, i.e. a piece of hardware is able to fine-adjust the skew (t1 and t2) of each signal path with high resolution. Auto-skew alignment compensates the extra skew introduced by cabling, adapters, and the intrinsic skew of the measurement instrument. Without such a capability, the signal integrity can be severely distorted, especially in jitter measurement and analysis of differential eye diagrams. The present method achieves high accuracy, limited only by the accuracy of the hardware DACs (digital to analog converters). Moreover, the present disclosure demonstrates the importance of skew accuracy and shows that the method can also potentially be utilized to accurately measure the differential skew of input signals.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, process, machines, manufacture, compositions of matter, means, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, or steps.

What is claimed is:

1. A method for auto-skew alignment of high-speed differential eye diagrams, said method comprising:
    providing a pair of time-dependent differential signals related to one another by a differential timing skew;
    constructing mathematical functions dependent on magnitudes of said differential signals and said differential timing skew;
    defining a figure of merit containing time integrals of said mathematical functions; and
    calculating an optimized value of said differential timing skew such that said figure of merit reaches a minimum value.

2. The method of claim 1 further comprising applying said optimized value of said differential timing skew to align the skew of high-speed differential eye diagrams involving said pair of time-dependent differential signals.

3. The method of claim 1 further comprising scaling said pair of time-dependent differential signals such that integration of said time integrals is performed over a random time interval including at least two consecutive bit periods of said pair of time-dependent differential signals.

4. The method of claim 1 further comprising acquiring the values of said differential signals and said differential timing skew using hardware instrumentation.

5. The method of claim 4 wherein the accuracy of said optimized value of said differential timing skew is limited only by skew resolution of said hardware instrumentation.

6. The method of claim 5 wherein said accuracy is less than or equal to one picosecond.

7. The method of claim 1 wherein said calculating is performed substantially automatically.

8. The method of claim 7 wherein said calculating includes a coarse search for said optimized value of said differential timing skew.

9. The method of claim 8 wherein a user-selectable coarse skew interval is inputted prior to said calculating.

10. The method of claim 7 wherein said calculating includes a fine search for said optimized value of said differential timing skew.

11. The method of claim 10 wherein said fine search is performed using an adaptively decreasing fine skew interval.

12. A system for auto-skew alignment of high-speed differential eye diagrams of a pair of time-dependent differential signals related to one another by a differential timing skew, said system comprising:
    paired skew circuits operable to delay each of said time-dependent differential signals independently;
    paired sampling circuits interconnected with said paired skew circuits, said sampling circuits operable to sample the waveforms of said time-dependent differential signals independently;
    a timebase generator operable to generate a common measurement timebase; and
    a processing unit operable to perform mathematical calculations using data acquired by said paired sampling circuits in accordance with an auto-deskew algorithm.

13. The system of claim 12 wherein said timebase generator is incorporated within an instrument mainframe.

14. The system of claim 12 wherein said paired sampling circuits are incorporated within a digital communications analyzer.

15. The system of claim 12 operable with a skew resolution of less than or equal to one picosecond.

16. The system of claim 12 wherein said processing unit is operable to construct mathematical functions dependent on said acquired data.

17. The system of claim 16 wherein said processing unit is operable to calculate a figure of merit containing time integrals of said mathematical functions.

18. The system of claim 17 wherein said processing unit is operable to calculate an optimized value of said differential timing skew such that said figure of merit reaches a minimum value.

19. The system of claim 18 wherein the accuracy of said optimized value of said differential timing skew is limited only by skew resolution of said acquired data.

20. The system of claim 12 wherein said processing unit is operable to perform substantially automatically in accordance with said auto-deskew algorithm.

* * * * *